March 30, 1965 S. L. MILLER 3,176,147

PARALLEL CONNECTED TWO-TERMINAL SEMICONDUCTOR DEVICES
OF DIFFERENT NEGATIVE RESISTANCE CHARACTERISTICS

Filed Nov. 17, 1959

INVENTOR
SOLOMON L. MILLER

BY Lester H. Clark
ATTORNEY 3,176,147
Patented Mar. 30, 1965

3,176,147

PARALLEL CONNECTED TWO-TERMINAL SEMICONDUCTOR DEVICES OF DIFFERENT NEGATIVE RESISTANCE CHARACTERISTICS

Solomon L. Miller, Poughkeepsie, N.Y., assignor to International Business Machines Corporation, New York, N.Y., a corporation of New York Filed Nov. 17, 1959, Ser. No. 853,484
2 Claims. (Cl. 307—88.5)

This invention relates to semiconductor devices having non-linear potential-current characteristics, and methods of making such devices.

It has been proposed to use a four region PNPN silicon diode as a non-linear switching device responsive to a direct potential applied across its terminals and having a low impedance to alternating current (of the order of one ohm) over one range of current and a high impedance to alternating current (of the order of ten megohms) over another range of current. While the PNPN silicon diodes produce highly desirable results insofar as the circuits are concerned, nevertheless, such diodes are difficult to manufacture from the standpoint of reproducibility of the shiftover points, i.e., the current at which the potential shifts from its low to high values and vice versa.

It is an object of the present invention to provide an impedance unit having a relatively high impedance at a low range of current and a relatively low impedance at a relatively higher range of current.

A further object of the invention is to provide an impedance unit of the type described in which the shiftover points are highly stable and are highly reproducible in manufacture.

Another object is to provide an impedance unit of the type described in a single integral semiconductor device.

A further object is to provide a method of making such an integral semiconductor device.

The foregoing and other objects of the invention are attained in the structures and methods described herein. The principal structure embodying the invention is a two terminal network consisting of a semiconductor body having four regions of alternately opposite conductivity types, and an Esaki diode connected in parallel with the junction between the two of the four regions nearest one of the end terminals.

In accordance with a presently preferred embodiment of the invention, the Esaki diode is constructed integrally with the four region semiconductor body, so that the network consists of two terminals connected to the ends of a single integral body.

Another feature of the invention is a method of making an integral body of the type described, starting with a three region PNP or NPN semiconductor body, diffusing into at least one end region of the body impurities effective to induce therein a degenerate region of the same type, alloying into one portion of the degenerate region a first impurity of a type effective to induce opposite type conductivity therein, and alloying into a second portion of said degenerate region, adjacent said first portion, a second impurity of a type effective to induce degenerate conductivity of said opposite type therein.

Other objects and advantages of the invention will become apparent from a consideration of the following specification and claims, taken together with the accompanying drawings.

*FIG. 1*

Figure 1:
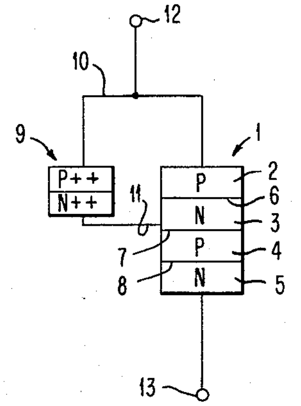
FIG. 1 is a wiring diagram of an impedance unit embodying the invention.

This figure illustrates an impedance unit constructed in accordance with the invention and including a four region PNPN semiconductor element generally indicated at 1, having four regions of alternately opposite conductivity types which are respectively indicated by the reference numerals 2, 3, 4 and 5. The regions 2 and 3 are separated by a boundary junction 6. The regions 3 and 4 are separated by a boundary junction 7. The regions 4 and 5 are separated by a boundary junction 8.

An Esaki diode generally indicated by the reference numeral 9 is connected in parallel with the junction 6 by means of wires 10 and 11. Wire 10 is connected to a terminal 12 and region 5 is connected to another terminal 13, which form two opposite terminals of a two-terminal network.

The Esaki diode, sometimes referred to as a tunnel diode, was first described in an article in the Physical Review for January 15, 1958, pages 603–604, by Leo Esaki, entitled "New Phenomeon in Narrow Germanium PN Junctions." As described by Esaki, this diode is a PN junction device in which the junction is very thin, i.e., narrow, in the currently accepted conventional terminology, (on the order of 150 Angstrom units or less) and in which the semiconductor materials on both sides of the junction have high impurity concentrations (of the order of $10^{19}$ net donor or acceptor atoms per cubic centimeter for germanium).

The Esaki diode has several unusual characteristics. One is that the reverse impedance is very low, approaching a short circuit. Another is that the forward potential-current characteristic has a negative resistance region beginning at a small value of forward potential (on the order of .05 volt) and ending at a larger forward potential (of the order of 0.2 volt). The potential value at the low potential end of this negative resistance region is very stable with respect to temperature. It does not vary appreciably over a range of temperatures varying from a value near zero degrees K. to several hundred degrees K. At potential values, outside the limited range described above, forward resistance of the Esaki diode is positive.

The Esaki article identified germanium as a semiconductor material having this property, and did not identify the impurity materials with which the phenomenon was observed. Further research has led to the belief that this phenomenon can be observed with most semiconductor materials at some temperature level, providing suitable donor and acceptor materials are available. The donor and acceptor materials must be capable of alloying into the matrix material with sufficient concentration to make the extrinsic material degenerate.

In this specification, a P type semiconductor is said to be degenerate if the Fermi level is either within the valence band or, if outside the valence band, it differs from the valence band edge of the energy gap by an energy not substantially greater than KT, where K is Boltzmann's constant and T is the temperature in degrees K. Similarly, an N type semiconductor is said to be degenerate if the Fermi level is either within the conduction band or, if outside the conduction band, it differs from the conduction band edge of the energy gap by an energy not substantially greater than KT.

In order that a semiconductor diode may have Esaki diode characteristics, the P and N type materials must be such that the valence band of the P type material overlaps the conduction band of the N type material. It is also necessary that the junction between the P and N type materials be very thin, i.e., on the order of 150 Angstrom units or less. Furthermore, it is preferable that the top of the valence band be above the Fermi level on the P side, and that the bottom of the conduction band be below the Fermi level on the N side. It has now been found that acceptor materials which may be introduced into germanium with sufficient concentrations to produce the Esaki effect include gallium, aluminum, boron and indium. Suitable donor materials for germanium include arsenic phosphorus and antimony.

Figure 3:
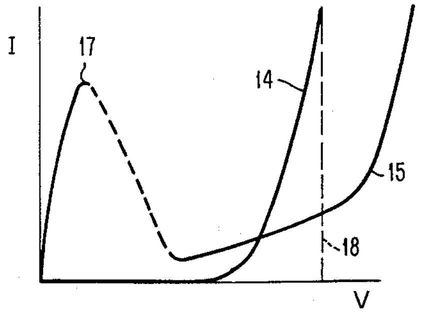
FIG. 3 is a graphical illustration of certain internal potential-current characteristics in the units of FIGS. 1 and 2.

The PN junction 6 has a potential-current characteristic illustrated at 14 in FIG. 3. The Esaki diode 9 has a potential-current characteristic illustrated at 15 in FIG. 3.

Figure 4:
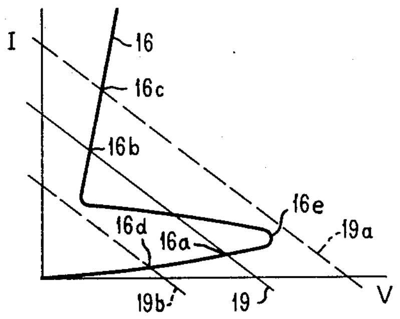
FIG. 4 is a graphical illustration of the overall characteristics of the impedance units of FIGS. 1 and 2.

FIG. 4 illustrates at 16 a potential-current characteristic which has been obtained in the prior art with a four region PNPN silicon diode. When such a diode is connected in circuit with a load having an impedance indicated by the slope of line 19, the diode may operate in a high impedance condition at intersection 16a, or in a low impedance condition at intersection 16b, depending on the current supplied. Assume that the diode is operating initially in its high impedance condition, at point 16a.

If a current pulse is supplied of a magnitude to shift the load line from 19 to 19a, then the circuit may operate stably only in the low impedance condition of the diode, at 16c. Then if that current pulse is removed, the operating point shifts to 16b, the diode retaining its low impedance.

If a current pulse is then supplied of a magnitude to shift the load line to 19b, then the circuit may operate stably only in the high impedance condition of the diode, at 16d. Then if the shifting current pulse is removed, the operating point shifts back to 16a, the diode retaining its high impedance.

Heretofore, this type of diode characteristic has been obtainable only with silicon, since germanium diodes do not have an alpha which varies with current flow, so that the appearance of a peak in voltage in the low current range (point 16e in FIG. 4) was seldom observed.

One of the essential features of an Esaki diode is that the peak 17 occurs at a very stable value of current. This peak value is stable with time and with temperature, at least over a wide operating range. It is also highly reproducible from one Esaki diode to the next. When an Esaki diode is connected as shown in FIG. 1, the non-linear impedance of the two terminal network between terminals 12 and 13 has a characteristic similar to that illustrated at 16 in FIG. 4. As the applied potential between the network terminals increases from zero (it is assumed that the terminal 12 is positive with respect to terminal 13), the junction 6 and the Esaki diode 9 are forwardly biased and junction 6 acts as an ohmic contact to the region 3. The NPN semiconductor, consisting of regions 3, 4 and 5, provides a high impedance, with the junction 7 reverse biased. This condition continues until the breakdown potential of junction 7 is reached. The Esaki current then increases rapidly, exceeding the peak current 17 of the Esaki diode 9. The potential across junction 6 and diode 9 quickly shifts to some value such as that shown at 18 in FIG. 3, where the sum of the currents through the diode 9 and parallel junction 6 equals the current through junction 7. This potential 18 is high enough so that the junction 6 is then effective to inject minority carriers into region 3. This minority carrier current has a value indicated by the intersection of characteristic 14 and abscissa 18 in FIG. 3. The Esaki diode current at that time is indicated by the intersection of characteristic 15 and abscissa 18. It may be noted that the minority carrier current through junction 6 is considerably greater than the Esaki diode current (which does not consist of minority carriers). The effective alpha of the overall impedance unit becomes greater than 1 and the A.C. impedance of the complete unit including the diodes 1 and 9 becomes very low.

There is thus provided in accordance with the present invention, a two terminal impedance network having a fixed value of impedance when the current is below a certain range and a different lower value of impedance when the current is in a different higher range.

The overall potential-current characteristic of the impedance unit of FIG. 1 is similar to that shown at 16 in FIG. 4. The maximum potential in the low current region range (corresponding to 16e) is determined in this impedance unit, by the breakdown potential of junction 7. However, the value of current at which the unit switches from its high impedance condition to its low impedance condition is determined by the current peak 17 of the Esaki diode characteristic 15, which is highly stable and readily reproducible. The unit of FIG. 1 is improved from both the standpoints of stability and reproducibility as compared to the prior art silicon diodes. Furthermore, it is possible in accordance with the present invention to secure this type of characteristic, stably and reproducibly, in diodes of other semi-conductor materials, including germanium.

*FIG. 2.*

Figure 2:
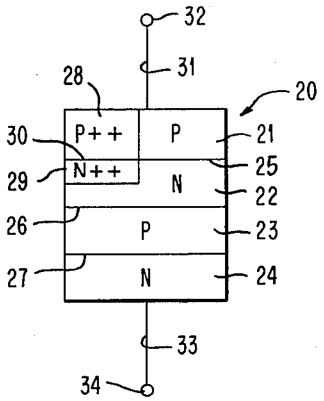
FIG. 2 is a diagrammatic illustration of a modified form of impedance unit embodying the invention.

A similar type of two terminal network may consist of one integral semiconductor body, as illustrated generally at 20 in FIG. 2, including four regions of alternately opposite conductivity types 21, 22, 23, and 24, separated respectively by barrier junctions 25, 26 and 27. An Esaki diode comprising a P+ region 28 and an N+ region 29 is formed integrally with the body 20 so that the junction 30 separating the regions 28 and 29 is electrically in parallel with the junction 25.

The region 21 is connected by a wire 31 to one terminal 32 of the two terminal network. The region 24 is connected by a wire 33 to the other terminal 34 of the two terminal network.

*FIGS. 5 to 9*

These figures illustrate a method of constructing a semiconductor device such as that illustrated in FIG. 2.

Figure 5:
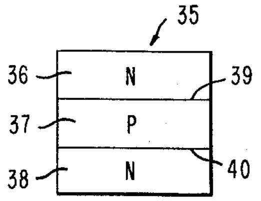
FIGS. 5 to 9 illustrate successive steps in a process of manufacturing the device of FIG. 2 in accordance with the present invention.
Figure 6:
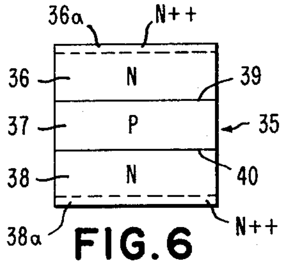

The starting material is an NPN germanium semiconductor body, such as those conventionally used for transistors and generally indicated at 35 in FIG. 5. The body 35 has three regions 36, 37 and 38 separated by boundary junctions 39 and 40. Alternatively, a PNP body may be used, with corresponding changes in the other materials.

The first step in the process is to diffuse degenerate N+ regions 36a and 38a into the N regions 36 and 38. This may be done by placing the body in an atmosphere containing arsenic and holding it at a temperature of 850° C. for five hours. This diffusion is commonly done when the NPN body is in the form of a large sheet, and before it has been cut into small dice such as the body 35 so that the N+ regions are diffused into only two N regions 36 and 38, and do not affect the P region 37, nor the sides of the regions 36 and 38.

Figure 7:
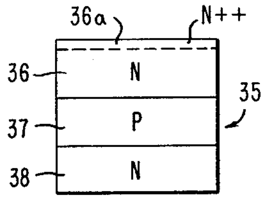

The next step in the process is to remove, as by lapping, one of the degenerate N+ regions. In FIG. 7, the semiconductor body is shown with the region 38a removed.

As one alternative, the region 38a may be left to provide a better ohmic contact. As another alternative, this N+ diffusing step of the process could be carried out after the dice are formed, in which case, the parts of the body where no diffusion is desired could be masked, and no removal of an undesired N+ region would be necessary.

Figure 8:
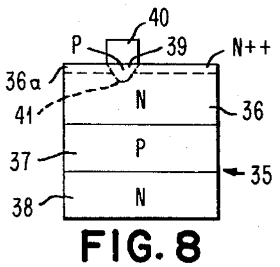
Figure 9:
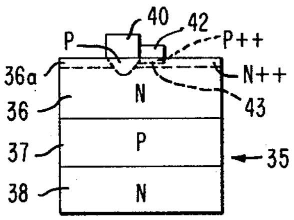

The next step is to alloy into the N+ region 36a a P region illustrated in FIG. 8 at 39. This may be done by placing an indium dot 40 on the top of the N+ region 36*a* and heating the semiconductor body at 550° C. for fifteen minutes. When this is done, the indium will alloy into the region 36*a* and will punch through that region, forming a PN junction 41 with the N region 36.

The next step is to place a small dot of tin gallium, generally indicated at 42, on the region 36*a* next to the antimony dot 40. The semiconductor is then heated above the melting point of tin gallium for a time long enough to wet the adjacent semiconductor surface. This time is usually of the order of a few seconds. The tin gallium dot must not punch through the region 36*a* so that there will be formed a junction 43 having Esaki diode characteristics. In one process embodying the invention, the indium dot was a 5 mil diameter sphere and the tin gallium was a 3 mil diameter sphere. If the two dots are separated on the surface of the semiconductor body, a heavy conductor must be soldered between the two dots so that they will both operate at the same potential. It is preferred, however, to secure the same result by having the dots touch and preferably overlap.

Other methods of making semiconductor bodies usable in two terminal networks of the type illustrated in FIG. 2 are illustrated in FIGS. 9–14 and claimed in the copending application of Richard F. Rutz, Serial No. 831,818, filed August 5, 1959, now United States Patent No. 3,079,512, issued February 26, 1963, and assigned to the assignee of the present application. In the methods described by Rutz, the PN junction corresponding to 41 and the Esaki diode junction corresponding to 43 are formed at the same time. The improved process described above is more amenable to control than the processes of Rutz.

While I have shown and described a preferred embodiment of my invention, other modifications thereof will readily occur to those skilled in the art and I therefore intend my invention to be limited only by the appended claims.

I claim:

1. A two-terminal network effective when supplied with increasing current to switch from a relatively high impedance condition to a relatively low impedance condition at a predetermined, stably maintained threshold value of current, comprising:

(*a*) a semiconductor body including a conductive path comprising in series four non-degenerate regions of alternately opposite conductivity types, each pair of adjacent regions being separated by a boundary junction;

(*b*) two terminals;

(*c*) means connecting the two regions at the ends of the series of four regions to the respective terminals;

(*d*) an Esaki diode comprising two adjacent degenerate regions of conductivity types respectively corresponding to the conductivity types of one of said end regions and the adjacent one of said four regions;

(*e*) means connecting the two regions of said diode directly to said two corresponding regions, said Esaki diode having a current-potential characteristic including a negative resistance region and having a peak current at the low potential end of the negative resistance region, the peak current of said Esaki diode being effective to determine the threshold value of current at which the unit switches from its low impedance condition to its high impedance condition.

2. An impedance unit having a relatively high impedance at a low current and a relatively low impedance at a higher current, comprising:

(*a*) an integral semiconductor body including a conductive a path comprising in series four non-degenerate regions of alternately opposite conductivity types, each pair of adjacent regions being separated by a boundary junction;

(*b*) two terminals;

(*c*) means connecting the two regions at the ends of the series of four regions to the respective terminals;

(*d*) a first degenerate region of a conductivity type corresponding to one of said end regions, said first degenerate region being adjacent and electrically connected to said one non-degenerate end region, (*e*) a second degenerate region of conductivity type opposite to said first degenerate region, said second degenerate region being adjacent and electrically connected to the non-degenerate region adjacent said one end region; and (*f*) said two degenerate regions being separated by a boundary junction electrically in parallel with the boundary junction between one non-degenerate end region and the adjacent non-degenerate region.

References Cited in the file of this patent

UNITED STATES PATENTS

| | | |
|---|---|---|
| 2,655,610 | Ebers | Oct. 13, 1953 |
| 2,862,160 | Ross | Nov. 25, 1958 |
| 2,866,140 | Jones et al. | Dec. 23, 1958 |
| 2,877,359 | Ross | Mar. 10, 1959 |
| 2,900,286 | Goldstein | Aug. 18, 1959 |
| 2,937,960 | Pankove | May 24, 1960 |
| 2,953,735 | Schmidt | Sept. 20, 1960 |
| 2,993,154 | Goldey et al. | July 18, 1961 |